United States Patent [19]

Roach

[11] 4,319,830
[45] Mar. 16, 1982

[54] MULTISPECTRAL LIGHT DETECTION SYSTEM

[76] Inventor: Terence Roach, 838 Bennett St., Fairfield, Conn. 06432

[21] Appl. No.: 64,340

[22] Filed: Aug. 6, 1979

[51] Int. Cl.$^3$ ............................................. G03B 27/72
[52] U.S. Cl. ......................................... 355/1; 355/68; 356/222
[58] Field of Search ........................ 355/1, 38, 68, 83; 356/443, 444, 222, 226, 225

[56] References Cited

U.S. PATENT DOCUMENTS

| | | | |
|---|---|---|---|
| 3,649,118 | 3/1972 | Yano et al. | 355/38 |
| 3,778,154 | 12/1973 | Denharadt et al. | 355/68 |
| 3,819,275 | 6/1974 | Aimi et al. | 355/38 X |

*Primary Examiner*—L. T. Hix
*Assistant Examiner*—W. J. Brady

[57] ABSTRACT

A multispectrum light detection system for controlling exposure time of a photoresist coated substrate in a projection aligner-printer machine wherein the relatively narrow spectral responsivity characteristics of a selected photoresist is matched to the wider spectrum inherent in the output flux of a combined light source and optical system. A representative sample of the system's wide spectrum output flux is divided into three or more narrower spectral bands each of which is measured by its own detector that provides an electrical signal proportional to the radiant flux intensity within that band. The resultant electrical signals from the separate spectral bands are weighted and combined in a summing amplifier to form a composite exposure control signal. Means are provided to adjust the contribution of each electrical signal to the combined control signal in accordance with known spectral response characteristics of the photoresist.

16 Claims, 6 Drawing Figures

MULTISPECTRAL LIGHT DETECTION SYSTEM

BACKGROUND OF THE INVENTION

Integrated circuits consist of functional devices, interconnects and isolators formed on or within the surface of a support substrate. Silicon wafers are the most common substrates. The components are formed in several sequential process steps.

In the manufacture of integrated cirucits or chips, a photoresist coated silicon wafer is exposed to radiant flux which interacts with the exposed portions of the photoresist material.

The interaction alters the molecular properties of the exposed photoresist. The photoresist materials fall into two major categories that are affected by exposure in opposite ways. One group, generalized as positive working, becomes soluble in developer only in those areas exposed to the radiations. Unexposed areas are not removed by the development and thus remain on the substrate.

The second group, negative working, becomes immune to developer action in the exposed areas. unexposed areas are removed by development.

Circuit patterns are placed on the wafer by exposure of the photoresist coating through a mask, containing transparent and opaque lines and areas, which defines the circuit pattersn or other elements.

The developed photoresist layer forms a process mask or shield that defines the areas to be affected by the subsequent process step.

Each mask comprises a plurality of the same patterns disposed in rows and columns so that after being fully processed the wafers are cut along rows and columns to provide a number of identical integrated circuits of chips.

The photoresist materials used for most integrated circuit fabrication are fundamentally responsive for exposure to radiation in a spectral region which includes the middle and near ultraviolet and visible blue light.

A convenient source of this radiation is the high pressure mercury arc lamp. The flux output of a mercury arc source is not smoothly distributed across the spectrum of interest but is characterized by a series of intense peaks or relatively narrow bandwidths superimposed on a continuum.

The peaks are inherent in their spectral placement but their relative intensities are a function of variabilities of lamp operation and construction.

The photoresist materials are not uniformally responsive to the available spectrum range from the mercury arc source.

In general, a resist is most responsive (and possibly optimized) to a narrow spectral region containing one of the spectral peaks.

One method of exposure of a photoresist coated wafer to circuit patterns of a mask is disclosed in U.S. Pat. No. 4,011,011 entitled Optical Projection Apparatus issued Mar. 8, 1977, and having the same assignee as a present application. In the patent, a carriage, holding the mask and wafer in aligned relationship, is scanned past a selected area illuminated by a light source.

The total energy incident on a given point of the photoresist can be controlled by the speed of the scanning motion.

If the illumination source were constant spectrally, and in intensity, it would be a simple matter to determine the optimum exposure time for a particular photoresist, and to set the speed of scan of a carriage, as disclosed in the above referenced patent.

Any change in emission level is monitored by a detection system that derives a control signal. This signal is used to change the scanning motion speed and thus correct the exposure. This system is embodied in the above referenced patent.

In this aforementioned system a compromise has been made in the spectral matching of the detector characteristics to the mercury lamp and photoresist properties.

A problem can be encountered if photoresist is used that has a different spectral response from that being monitored by the emission level detector, and if the lamp emissions change in a non uniform manner spectrally.

The present invention relates to an apparatus for providing a control signal which changes in accordance with variations in the output of a light source when measuring at one or more points in the emitted spectrum.

SUMMARY OF THE INVENTION

The present invention relates to a system for monitoring a light source used for exposure of photoresists, at a plurality of selected discrete points in the emitted spectrum, and to provide an output electrical signal which is a composite of the intensities of the emitted radiation at those selected discrete points in the emitted spectrum. Variation in the intensities at one or more of the discrete bandwidths is reflected in the composite signal. The composite signal is a measure of the exposure effectiveness of the light source for a particular photoresist whose spectral response characteristics are known. The composite signal may also be used to control the exposure energy e.g. by controlling the speed of scan of an aligned mask and wafer past the area irradiated by the light source.

More particularly the present invention comprises a plurality of light pipes, one for each spectral channel to be detected. One end of each light pipe is exposed to the light source while the other end is coupled to a light filter having the desired narrow band transmission characteristic. In some applications the light source may be coupled directly to the light filters.

The output flux in a particular transmission band from each filter is converted into an electrical signal, and then these electrical signals are combined into a composite signal. Before combination into a composite signal each signal may be adjusted in accordance with known spectral responsivity of the photoresist to be used.

DESCRIPTION OF THE DRAWINGS

FIG. 6 is a graphic representation of a weighted composite of the signals from the three detectors, to approximate the photoresist response given in FIG. 1, curve a.

DESCRIPTION OF THE INVENTION

The useful spectral range to which many microcircuit fabrication photoresists are sensitized falls between 350 nm and 450 nm. However, other less commonly used resists exist that are optimized for shorter wavelengths.

Figure 1:
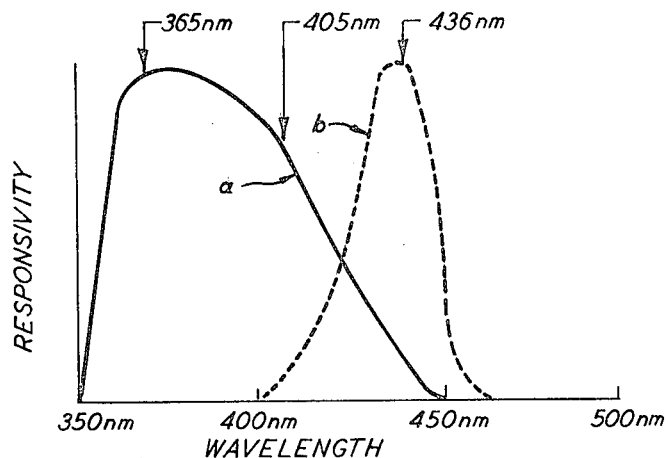
FIG. 1 shows spectral response curves of two typical photoresist materials.

FIG. 1 shows a graph of the spectral responsivity of two hypothetical resists; these representative responses are shown to illustrate the operation of the invention.

Figure 2:
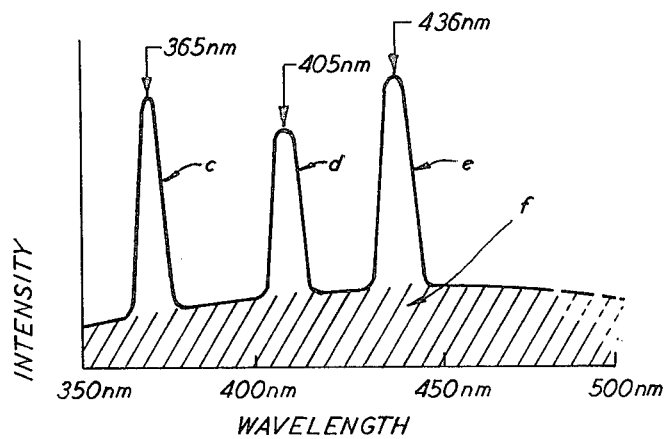
FIG. 2 is a curve representing the spectra of a typical high pressure mercury vapor lamp used for photoresist exposure at start of lamp life.

FIG. 2 shows in graph form the output intensity of a typical high pressure mercury lamp versus wavelength at the start of lamp life. The flux output of such a lamp over the spectral region to which the photoresists are sensitized is characterized by a series of intensity peaks or lines superimposed on a continuum base. Within the spectrum or the resists shown in FIG. 1, exist significant mercury lamp intensity peaks at 365 nm, 405 nm and 437 nm. Other peaks exist that are of interest for resist exposure at shorter wavelengths (to approximately 250 nm).

Figure 3:
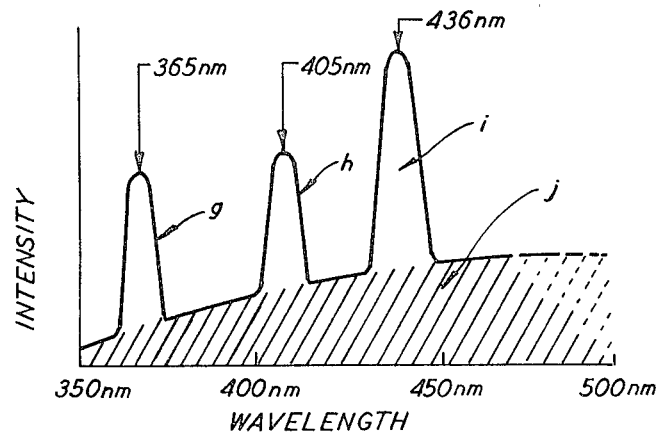
FIG. 3 as FIG. 2 but after accumulated operational lifetime.

As the high pressure mercury lamp accumulates operating time some significant change takes palce in the spectrally related energy output. The nature of this change is shown in graphical format in FIG. 3. The tendency is for the shorter wavelengths to be reduced in intensity, 365 nm peak (g) is lower than a FIG. 2(c). The 405 nm peak (h) is effected to a lesser degree while the 436 nm peak (i) may increase slightly. Often an increase is seen in the energy present in the continuum (j) with the ageing process.

The spectral transmission of the optical system used by the machine has some modifying effect on the spectral output of the lamp. It can be seen from FIGS. 1 and 2 that the actual exposure effectiveness of the mercury light source is a function of the sensitivity of the photoresist material. A resist material with a high responsivity in a spectral region containing one or more of the intensity peaks (c,d,e) would be exposed faster than a similar material that exhibited its highest response spectrally separated from the intensity peaks. This, of course, assumes similar energy responsivity.

In addition to the exposure flux present in the intensity peaks, significant energy is avaliable from the continuum (f). The energy from the continuum that conributes to the resist exposure will be greater in a resist with a wide responsivity spectrum and lesser with a resist specifically made responsive to one of the intensity peaks only.

In actual practice it is found that the photoresists exhibit a sensitivity to a spectrum containing one or two peaks plus the continuum associated with these peaks.

Present methods of controlling exposure in a photoresist exposure or printing machine are based on a photodetector with spectrally shaped responsivity. This detector monitors the relative intensity of a representative sample of the available exposure flux.

The detector output is an electrical signal, which after amplification is used to control the total exposure flux allowed to impinge upon the photoresist.

A problem associated with this method is caused by differences existing in the relative spectral responses of the detector devices and the photoresists being exposed. In this event it is possible that the variations in spectral intensities in the lamp-machine output can affect the photoresist spectral region in a different manner than the detector spectral region. Thus an improperly exposed photoresist will result.

It would be possible to use a detector response that matches the specific photoresist being exposed.

This arrangement is used, but has the shortcoming of requiring different detectors for different resists. Minor secondary alterations in resist spectral response caused by process variabilities would be very difficult to accomodate with this method.

The present invention utilizes a technique that provides an improvement in the matching in the spectral responses of many different photoresists and the exposure system.

While a criterion for the adequate functioning of the present invention consists of proper spectral matching of photoresist and light source, the invention is not confined to the particular parameters chosen in this description and will, of course, function with properly matched parameters other than the 365 nm, 404 nm and 435 nm wavelengths.

Figure 4:
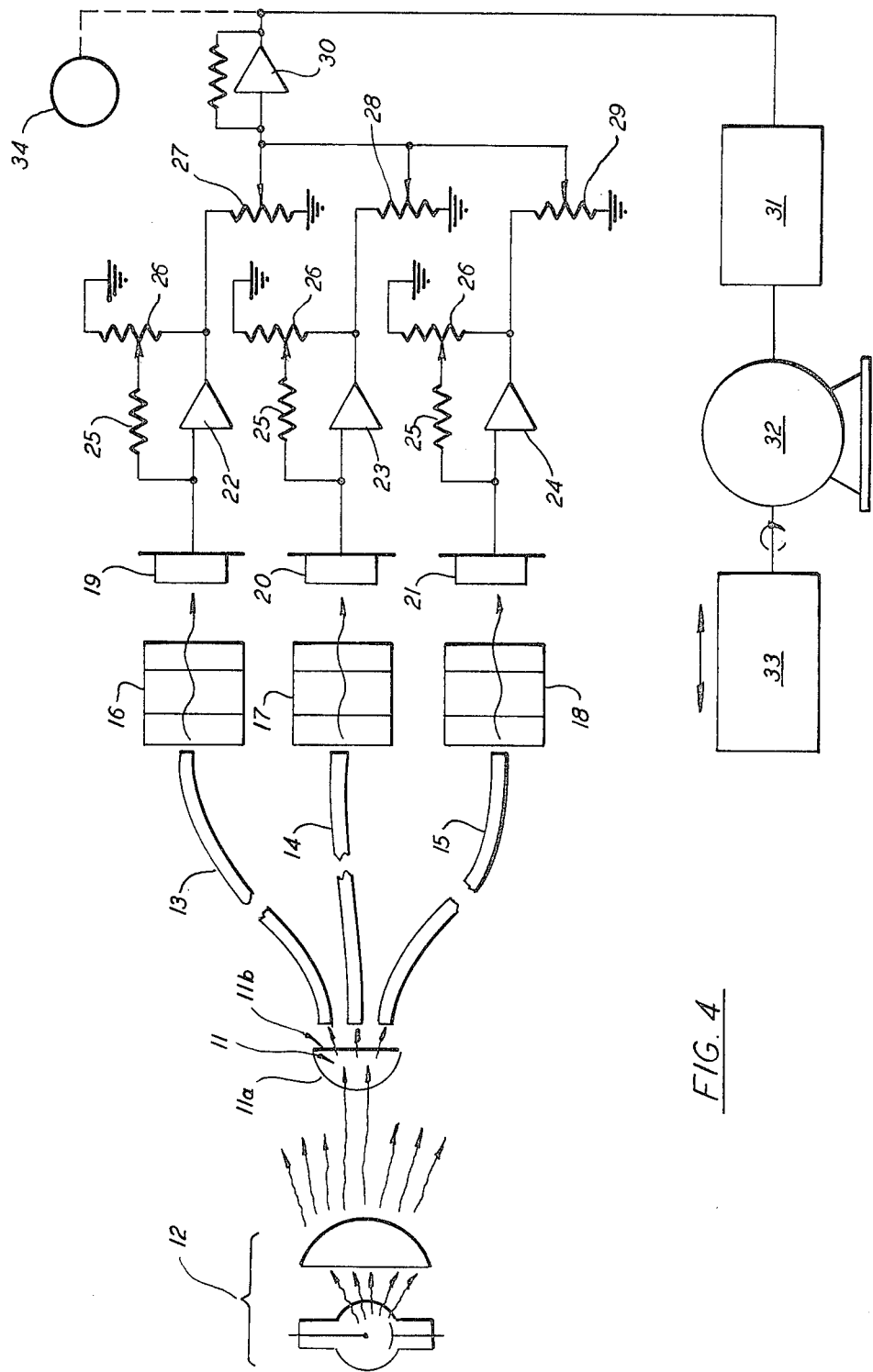
FIG. 4 is a view, partially block diagram and partially schematic, of a preferred embodiment of the present invention.

Referring now more particularly to FIG. 4 there is shown a preferred embodiment of the present invention.

A collector 11 is positioned to receive light or flux from a light source 12 which may be a mercury vapor lamp and optical system. The collector may be of hemispherical form or other shapes that enhance flux collection efficiency.

The collector material shall have high transmittance to the flux wavelengths involved; fused silica and some glasses may be used.

The curved surface 11a can be polished, and the flat surface 11b can be of roughened or ground finish, to promote diffusion of the flux being transmitted. This diffusion provides a homogeneous mix of the flux emerging from the surface 11b. The diffusive mixing can be increased further by similar treatment of the input surface 11a.

Light transmitting pipes 13, 14 and 15 each have an end disposed next to the flat 11b to receive light. These light pipes 13, 14 and 15 can be commercially available flexible lengths comprising a fused silica core clad with silicon resin. Other materials can be used for the light pipes including some plastics. For certain applications rigid light pipes would be useable. Unclad light pipes have been used with lower resultant transmission efficiencies. The light pipes may be of any length convenient for positioning the rest of the system as desired e.g., away from the light source or the system whose light is being monitored. The light pipes 13, 14 and 15 transmit the wide band light flux with minimum losses induced by bends or turns therein.

While shown as single strands each light pipe 13, 14 and 15 may comprise multiple strands, if desired.

Optical bandpass filters 16, 17 and 18 are disposed adjacent to the other ends of light pipes 13, 14 and 15 respectively, to receive the light flux from its respective light pipe. Each filter 16, 17 and 18 is designed to have a transmission band centered on one of the principle lamp spectral peaks within the normal photoresist exposure range. For a typcial mercury vapor lamp light source used in an photoresist exposure system these peaks may be 365 nm, 404 nm and 436 nm as previously discussed. For example, filter 16 is designed to pass a light band approximately 50 nm wide (at half power points) centered on 365 nm. In a similar manner each of filters 17 and 18 pass a light band centered on 404 nm and 436 nm, respectively.

The filters 16, 17 and 18 may be of any convenient structure having the desired bandpass properties e.g., each may consist of multiple, bulk type glass filters or interference type filters which when combined into a single assembly yield the desired band transmission characteristics.

The light pipes provide a means to convey the light flux from the flux sampling point to the optical filters. This yields, in many applications, better overall system performance. This improvement is essentially due to removal of size and other physical and electrical noise constraints associated with sample point placement of the detector-filter assembly.

However, it must be understood, that in certain applications, the system can be operated without the light pipes, i.e., the input flux directly incident on the light filters.

Detectors 19, 20 and 21 are disposed closely adjacent to filters 16, 17 and 18 respectively, for receiving the optical flux which has been spectrally selected by each of the filters 16, 17 and 18. The detectors provide an output current proportional to the intensity of the input flux. The detectors 19, 20 and 21 may be of any convenient type e.g., each may consist of photovoltaic mode silicon photodiodes with suitable spectral responsivity for the application. Vacuum photodiodes with solar blind type photocathodes can be used for shorter wavelength passbands, i.e., below 340 nm.

The outputs of each of the detectors 19, 20 and 21 are connected to the input terminals of current to voltage converters 22, 23 and 24, respectively, which convert the current input to a voltage signal. The current to voltage converters 22, 23 and 24 may take the form of operational amplifiers as shown in the drawing.

Each operational amplifier 22, 23 and 24 has a high input impedance and a feedback resistance 25 and 26 with resistance 26 being variable to permit variation in the feedback signal to provide a suitable means to calibrate the relative gain or sensitivity of each detector channel.

Each of the output terminals from the current to voltage converters or operational amplifiers 22, 23 and 24 are connected to the inverting input of an operational amplifier 30.

The outputs from each of the operational amplifiers 22, 23 and 24 are connected to the operational amplifier 30 through voltage dividers 27, 28 and 29, respectively.

The output of the operational amplifier 30 is connected to a electronic circuit 31 that provides the electrical drive signal to motor 32 whose mechanical output is connected to a carriage mechanism 33.

The output of the operational 30 amplifier may be connected to a signal measuring device such as an oscilloscope or meter 34 either alternatively or in addition to the connection to the electronic circuit 31.

The voltage dividers 27, 28 and 29 permit the separate signals from the operational amplifiers 22, 23 and 24 to be individually adjusted for level prior to presentation to the summing operational amlifier 30. This permits the overall spectral output of the combined spectrally separated channels to be shaped to provide an approximation of the desired photoresist activity response.

Given a desired photoresist response, the voltage dividers 27, 28 and 29 may be replaced by a pre-programed plug-in circuit card having the required resistances that match the combined system response to the specific photoresist.

Figure 5:
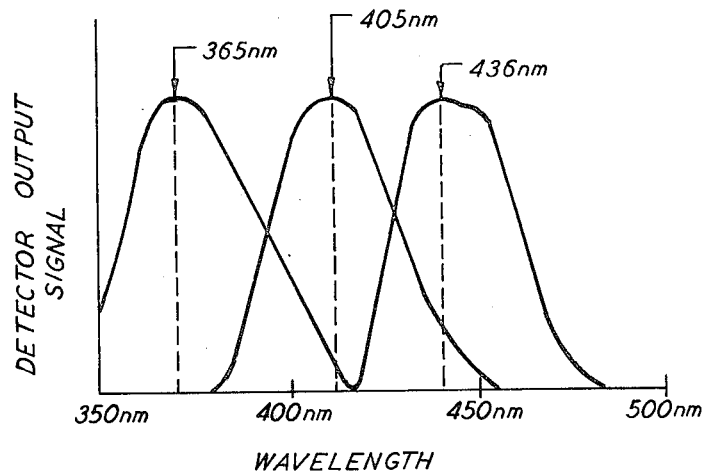
FIG. 5 is a graphic representation of the electrical signals produced by three detectors.

FIG. 5 is a graphical representation of the output of the photodiode detectors 19, 20 and 21 and hence the output of the operational amplifiers 22, 23 and 24 prior to adjustment of the voltage dividers. Note here the representation shown is that it would result when measuring a source with a constant flux intensity across the spectrum shown. In actual practice the characteristic mercury source lines would be strongly indicated on the detector output. They have been omitted for clarity.

Figure 6:
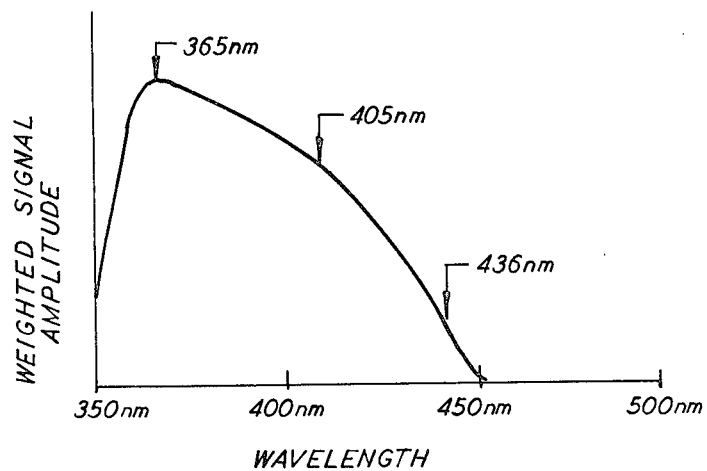

FIG. 6 is a graphical representation of the composite signal from operational amplifier 30 after the voltage dividers have been adjusted to provide a weighting favoring the shorter wavelengths. The response resulting would be that to match the resist response given in FIG. 1a. This adjustment of the composite signal is based on the assumption that this specific photoresist is most responsive to flux at 365 and 404 nanometers and far less to the 436 nanometer line. As in FIG. 5 the light flux induced peaks occurring specifically at 365 nm, 405 nm and 436 nm have been omitted. By use of the voltage dividers or plug-in resistance networks the composite signal can be adjusted to conform to or match other photoresists of different spectral responsivities.

The composite signal, once adjusted, is used to control the exposure time of the photoresist. Thus, it can be used via electronic circuit 31 to drive the motor 32 whose output speed is a function of the amplitude of the composite signal. The motor 32 in turn is used to drive a carriage 33. The carriage 33 may be of the type disclosed in the above referred to U.S. Pat. No. 4,011,011 on which a mask and photoresist coated wafer are mounted in optical alignment and moved past an arcuate area or irradiation which projects flux through the mask onto the photoresist coated surface of the wafer. The speed at which the carriage is moved past the irradiated area controls the exposure time and therefore the total exposure energy incident on the photoresist.

The composite signal which drives the motor 32 may be adjusted for a given photoresist characteristic, and once set drives the carriage 33 at a predetermined speed to provide correct exposure of the photoresist. If the flux intensity at one or more of the sensitive wavelength bands centered respectively on 365, 405, or 436 nanometers should change, the compsite signal will change proportionally. The change in the composite signal applied to the electronic circuit causes the speed of the motor and therefore the speed of scan of the carriage 33 to change accordingly up or down. Thus, if the flux source reduces emission at the 365 wavelength, the composite signal would reduce in amplitude accordingly and the speed of the carriage would slow down to insure correct exposure by a proportionate decrease in scanning speed. If the flux source stopped emitting flux at all of the critical wavelengths i.e., those to which the photoresist is responsive, the composite signal would drop to zero causing the carriage to stop since under such a condition there would be no exposure.

It should be noted that the wavelengths chosen for purposes of explanation are the three at which high pressure mercury lamps characteristly emit a high flux intensity and to one or more of which commercial photoresists are designed to be sensitive. However, the invention would work for different wavelengths of flux suitable for exposure of compatible photoresists.

In addition while the invention is described with reference to three spectral channels, more or less channels could be used in accordance with the same principles described above.

The meter or oscilloscope 34 may be used to measure the composite signal both before and after proportioning or weighting adjustments. If measured before adjustment, and if the responsivity of each channel is correctly calibrated, the meter measures total relative intensity at the wavelengths of interest.

After adjustment or weighting, to the desired photoresist spectral characteristic, the measurment is of the adjusted spectrally shaped signal and is useful for matching purposes. The weighted flux intensity at each spectral channel can be measured by opening the circuit in the other two channels.

Other modifications of the present invention are possible in light of the above description which should not be construed as limiting the invention beyond those limitations expressly contained in the claims which follow.

What is claimed is:

1. A system for monitoring light from a light source comprising in combination,
   a plurality of light selector means,
   filter means associated with each of said light selector means for transmitting light of a preselected bandwidth from each of said selector means,
   detector means associated with each of said filter means for converting each of said preselected bandwidths of light to an electrical signal,
   summing means connected to said detector means providing an output signal which is a composite of each of said electrical signals from each detector means,
   a motor connected to the output of said summing means providing a mechanical output having a speed proportional to said composite signal.

2. A system according to claim 1 wherein each of said dectector means includes,
   first means for varying the output from each of said detector means.

3. A system according to claim 2 wherein each of said detector means includes,
   second means providing an output current proportional to the light intensity at said preselected bandwidth.

4. A system according to claim 3 wherein each of said detector means includes,
   third means connected to said second means for converting said current to a voltage.

5. A system according to claim 4 wherein said first means is connected to said third means.

6. A system according to claim 5 wherein each of said second means comprises,
   a photovoltaic mode silicon photodiode.

7. A system according to claim 6 wherein each of said third means comprises,
   an operational amplifier.

8. A system according to claim 7 wherein each of said first means comprises,
   a voltage divider having an input connected to the output of each of said operational amplifiers,
   each of said voltage dividers having a common output to said summing means.

9. A system according to claim 8 wherein said summing means comprises an operational amplifier.

10. A system according to claim 7 wherein said first means comprises a preset plug-in circuit board.

11. A system according to claim 10 wherein each of said light selector means comprises,
    a flexible light pipe each having one end adjacent said filter means and the other end disposed for receiving light friom the light source.

12. A system according to claim 11 wherein each of said flexible light pipes are comprised of,
    fused silica clad with silicon resin.

13. A system according to claim 12 further comprising,
    a light collector disposed between the light source and said other end of each of said light pipes.

14. A system according to claim 13 wherein each of said filter means comprise,
    a filter disposed between said one end of a respective light pipe and a respective one of said silicon photodiodes,
    each of said filters having a preselected light transmission band.

15. A system according to claim 14 further including,
    measuring means connected to the output of said voltage dividers for measuring the light intensity at one or more of said preselected bandwidths.

16. A system according to claim 1 further including,
    a carriage mounting an aligned mask and photoresist coated wafer,
    a light source projecting an illuminated area,
    said motor connected to said carriage for causing said carriage to scan just said illuminated area at a speed determined by the amplitude of said composite signal for projecting light through said mask onto said wafer.

* * * * *

UNITED STATES PATENT AND TRADEMARK OFFICE
CERTIFICATE OF CORRECTION

PATENT NO. : 4,319,830
DATED : March 16, 1982
INVENTOR(S) : Terence Roach

It is certified that error appears in the above-identified patent and that said Letters Patent are hereby corrected as shown below:

Column 1, line 10, change "cirucits" to --circuit--,

Column 1, line 23, change "unexposed" to --Unexposed--,

Column 1, line 28, change "pattersn" to --patterns--,

Column 1, line 46, change "or" to --of--,

Column 1, line 61, change "a" first occurrence to --the--,

Column 3, line 24, change "palce" to --place--,

Column 3, line 47, change "conributes" to --contributes--,

Column 5, line 59, change "amlifier" to --amplifier--,

Column 5, line 65, change "pre-programed" to --pre-programmed--,

Column 6, line 33, change "or" to --of--,

Column 6, line 44, change "compsite" to --composite--,

UNITED STATES PATENT AND TRADEMARK OFFICE
CERTIFICATE OF CORRECTION

PATENT NO. : 4,319,830

DATED : March 16, 1982

INVENTOR(S) : Terence Roach

It is certified that error appears in the above-identified patent and that said Letters Patent is hereby corrected as shown below:

Column 7, line 8, "measurment" to --measurement--,

Column 8, line 21, change "friom" to --from--.

Signed and Sealed this

Sixteenth Day of November 1982

[SEAL]

Attest:

Attesting Officer

GERALD J. MOSSINGHOFF

Commissioner of Patents and Trademarks